(12) United States Patent
Ando et al.

(10) Patent No.: US 6,424,080 B2
(45) Date of Patent: Jul. 23, 2002

(54) PIEZOELECTRIC ELEMENT AND METHOD OF PRODUCING THE SAME

(75) Inventors: Akira Ando, Omihachiman; Koichi Hayashi; Masahiko Kimura, both of Kusatsu, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/773,951

(22) Filed: Feb. 1, 2001

(30) Foreign Application Priority Data

Feb. 1, 2000 (JP) ........................................ 2000-023707

(51) Int. Cl.[7] ............................................. H01L 41/187
(52) U.S. Cl. ...................................................... 310/358
(58) Field of Search ........................ 310/313 R, 313 A, 310/358

(56) References Cited

U.S. PATENT DOCUMENTS

| 4,350,916 | A | * | 9/1982 | August et al. | ........... 310/313 B |
| 4,564,782 | A | * | 1/1986 | Ogawa | ........................ 310/359 |
| 5,914,068 | A | * | 6/1999 | Hiratani et al. | ........ 252/62.9 R |
| 6,248,394 | B1 | * | 6/2001 | Du et al. | ..................... 427/100 |

FOREIGN PATENT DOCUMENTS

| JP | 3-94487 | * | 4/1991 | ............. 310/313 R |
| JP | 5-129675 | * | 5/1993 | ............. 310/313 R |
| JP | 2001-102811 | * | 4/2001 | ............. 310/313 R |

* cited by examiner

*Primary Examiner*—Thomas M. Dougherty
(74) *Attorney, Agent, or Firm*—Ostrolenk, Faber, Gerb & Soffen, LLP

(57) ABSTRACT

A piezoelectric element contains a piezoelectric ceramic body having a layered perovskite structure, and has the C axis selected and oriented in the thickness direction. In the piezoelectric ceramic body, line shaped electrodes are formed perpendicular to the C axis selected and oriented. The electrodes exposed at both of the end faces of the piezoelectric ceramic body are covered with conductive materials and insulation materials. The piezoelectric ceramic body is polarized in the opposite directions on both of the sides of electrodes arranged in the width direction. Moreover, external electrodes are formed on the faces where the conductive materials and the insulation materials are formed, whereby two groups of the electrodes are arranged in an interdigital electrode form.

9 Claims, 9 Drawing Sheets

PIEZOELECTRIC ELEMENT AND METHOD OF PRODUCING THE SAME

BACKGROUND OF THE INVENTION

1. Field of the Invention

The present invention relates to a piezoelectric resonator, and more particularly, to a piezoelectric element for use as an oscillator in a communication filter and a clock generator.

2. Description of the Related Art

As one of conventional piezoelectric elements, known is a piezoelectric element produced by polarizing a piezoelectric ceramic body having a layered perovskite structure perpendicular to the orientation axis of the piezoelectric ceramic body. In such a piezoelectric element, electrodes are formed on both of the end faces of the piezoelectric ceramic body. Piezoelectric vibration can be excited by applying an electric field in the polarization direction.

Moreover, the inventors of the present invention have proposed a piezoelectric element of such a type that interdigital electrodes are formed on the front and back main faces of a single plate piezoelectric ceramic body for excitation. This piezoelectric element does not use a lamination process with a large number of steps. Accordingly, the piezoelectric element can be utilized conveniently, industrially, and has a high reliability with no problem on the optimization of coupling of an electrode interface to a ceramic.

Referring to the piezoelectric element produced by forming electrodes on both of the end faces of a piezoelectric ceramic body having a layered perovskite structure, and polarizing the ceramic in the direction perpendicular to the orientation axis, it is necessary for the piezoelectric element to have a sheet or rod shapes structure elongating in the electric field application direction. Such a structure has the problem that the electrostatic capacitance is low and the impedance is high, so that it is difficult to achieve impedance matching to a circuit.

Moreover, as regards the piezoelectric element in which the interdigital electrode is formed on a main face of a single plate piezoelectric ceramic body, e.g., the back main face thereof, it is necessary to reduce the thickness of the element in order to polarize the whole of the element when the piezoelectric element is used at a high frequency. This causes the problem that the mechanical reliability of the piezoelectric element can not be enhanced when the element is used at a high frequency.

SUMMARY OF THE INVENTION

Accordingly, it is a main object of the present invention to provide a piezoelectric element which has a low impedance, a high electromechanical coefficient and a high-frequency low-loss characteristic, even though the element uses a piezoelectric ceramic body having a layered perovskite structure.

Moreover, it is another object of the present invention to provide a method of producing the above piezoelectric element.

To achieve the above objects, there is provided a piezoelectric element according to the present invention which comprises a piezoelectric ceramic body having a layered perovskite structure of which at least the C axis of the crystallographic axes is oriented, and which is polarized substantially in the perpendicular to the orientation direction of the C axis, and plural electrodes arranged on respective planes substantially in parallel to the polarization direction of the piezoelectric ceramic body in the piezoelectric ceramic body, the plural electrodes being arranged so that the electrodes connected to one potential and the electrodes connected to the other potential contain parts thereof which are adjacent to each other.

Preferably, the plural electrodes are arranged in an interdigital electrode form.

Plural electrodes may be provided on multistages in the orientation direction of the C axis. In this case, electrodes overlapped with each other are connected to the same potential.

Preferably, the piezoelectric ceramic body is polarized in two opposite directions between electrodes overlapped with each other and other electrodes overlapped with each other.

Moreover, there is provided a method according to the present invention of producing a piezoelectric element which comprises the steps of: using a piezoelectric body material having a layered perovskite structure to prepare a green sheet; printing an electrode paste so that the plural electrode pastes printed are arranged substantially parallel to each other on the green sheet; laminating the green sheets so that the printed electrode pastes are interposed between the piezoelectric body materials, respectively, whereby a laminate is formed; and firing the laminae, and thereafter, polarizing the fired laminate, the piezoelectric body materials being polarized substantially perpendicular to the orientation direction of the C axes after the C axes of the piezoelectric body materials are oriented substantially in parallel to the lamination direction of the laminate.

In the piezoelectric element of the present invention, the piezoelectric ceramic body having a layered perovskite structure of which at least the C axis of the crystallographic axes is selected and oriented is used, and is polarized substantially in the direction perpendicular to the orientation axis, and the plural electrodes are arranged on planes substantially parallel to the polarization directions. Thereby, an electric field can be applied substantially perpendicular to the C axis of the piezoelectric ceramic body. Moreover, the polarization direction of the piezoelectric ceramic body has a component thereof substantially perpendicular to the C axis selected and oriented. Therefore, a single mode piezoelectric vibration can be realized.

Preferably, the plural electrodes are arranged in an interdigital electrode form so that an electric field is applied in the above direction.

In the piezoelectric element, the electrodes may be provided on multistages in the orientation direction of the C axis. At this time, electrodes overlapped with each other are connected to the same potential. Thus, an electric field can be applied in the same direction in the areas where the polarization direction is the same.

Moreover, preferably, the piezoelectric ceramic body is polarized in two opposite directions between electrodes overlapped with each other and other electrodes overlapped with each other. Thereby, areas are formed in which the ceramic is polarized in the opposite directions to the perpendicular to the C axis selected and oriented. An electric field is applied in the same direction as the polarization direction, so that a single mode piezoelectric vibration can be obtained.

The above-described objects, other objects, features, and advantages of the present invention will be more apparent from the following detailed description of embodiments of the present invention made with reference with the drawings.

DESCRIPTION OF THE PREFERRED EMBODIMENTS

Figure 1:
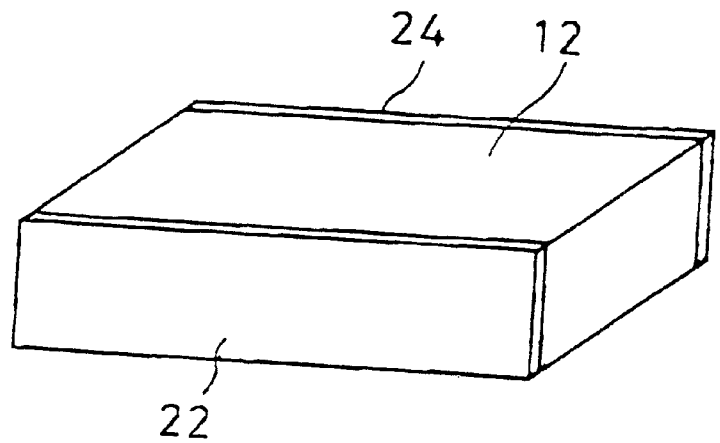
FIG. 1 is a perspective view showing an example of the piezoelectric element of the present invention.
Figure 2:
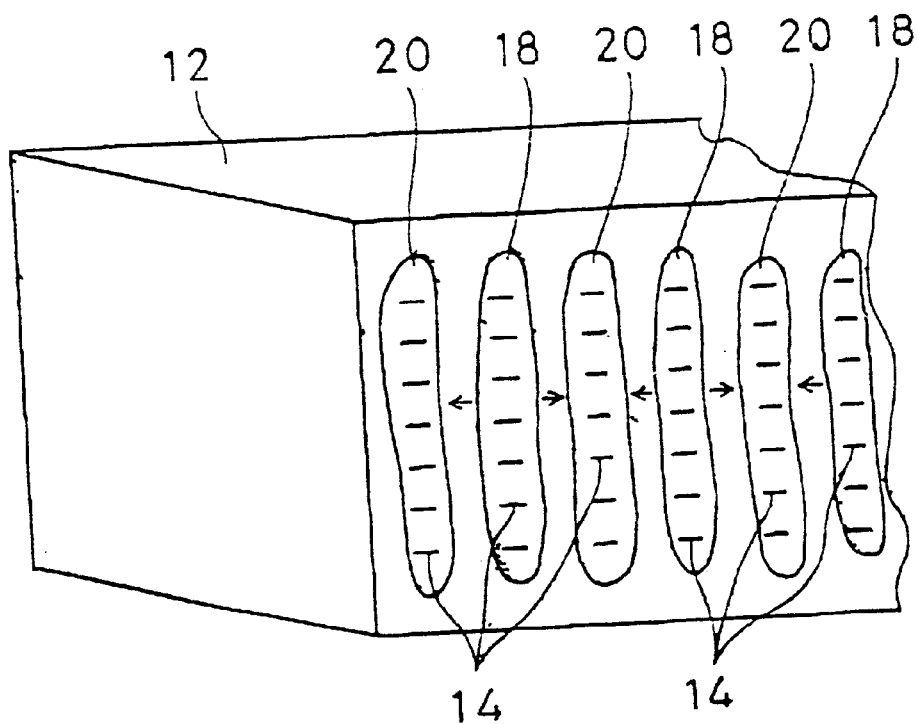
FIG. 2 illustrates an end face of a piezoelectric ceramic body used in the piezoelectric element of FIG. 1.
Figure 3:
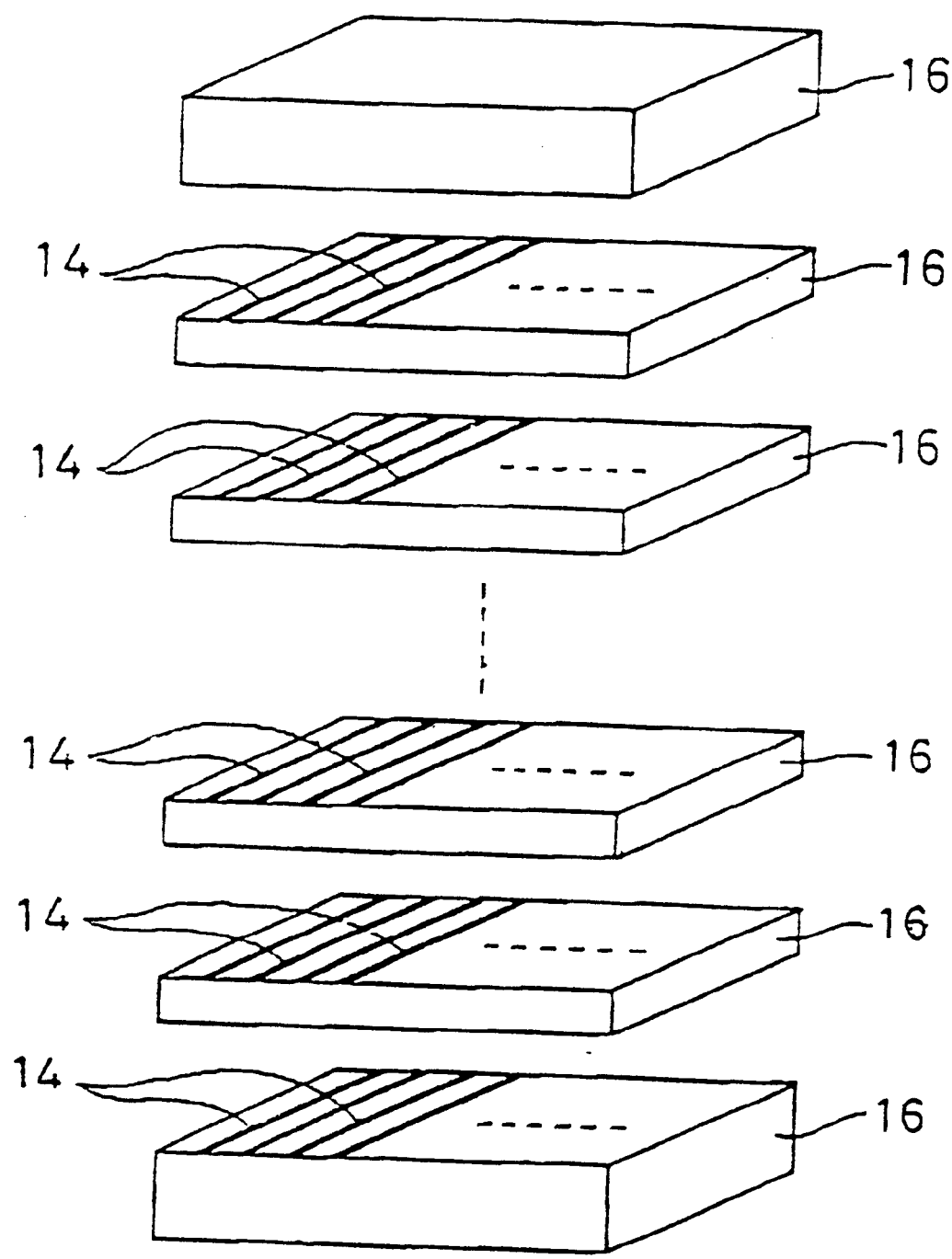
FIG. 3 is an exploded perspective view of the piezoelectric ceramic body shown in FIG. 2.

FIG. 1 is a perspective view showing an example of the piezoelectric element of the present invention. A piezoelectric element 10 contains a piezoelectric ceramic body 12. Plural electrodes 14 are formed in the piezoelectric body ceramic 12, as shown in FIG. 2. These electrodes 14 are formed in parallel to each other so as to elongate in the width direction on plural layers 16 (FIG. 3). These layers 16 are laminated whereby the piezoelectric body ceramic 12 containing the plural electrodes 14 is formed. Layers 16 are laminated so that the electrodes 14 formed on the respective layers 16 overlap each other in the thickness direction.

The piezoelectric ceramic body 12 has a layered perovskite structure, and the C axis is selected from the crystallographic axes and is oriented in the thickness direction. Here, the C axis indicates the major axis of the crystal. That is, in the piezoelectric ceramic body 12, the C axis is oriented so as to become perpendicular to the electrodes 14. Moreover, the piezoelectric ceramic body 12 is polarized in the longitudinal direction. That is, the polarization direction of the piezoelectric ceramic body 12 is substantially perpendicular to the C axis selected and oriented. At this time, as indicated by arrows in FIG. 2, the piezoelectric ceramic body 12 is polarized so that the polarization directions are opposite to each other, on both sides of electrodes 14 arranged in the thickness direction of the piezoelectric ceramic body 12.

Moreover, the electrodes 14 arranged in the thickness direction of the piezoelectric ceramic body 12 are covered with conductive materials 18 and insulation materials 20, respectively. On one of the side faces of the piezoelectric ceramic body 12, the conductive materials 18 and the insulation materials 20 are alternately arranged. On the other side face of the piezoelectric ceramic body 12, the electrodes 14 covered with the conductive materials 18 on the first side face of the piezoelectric ceramic body are covered with the insulation materials 20, respectively, while the electrodes 14 covered with the insulation materials 20 are covered with the conductive materials 18.

Moreover, external electrodes 22 and 24 are formed on both of the end faces in the width direction of the piezoelectric ceramic body 12, as shown in FIG. 1. The internal electrodes 14 are electrically connected to the external electrode 22 via the conductive materials 18 formed on the one side face of the piezoelectric ceramic body 12. The internal electrodes 14 are electrically connected to the external electrode 24 via the conductive materials 18 formed on the other side face of the piezoelectric ceramic body 12. Thus, the electrodes 14 connected to the external electrode 22 on one side and the electrodes 14 connected to the external electrode 24 on the other side are arranged in an interdigital electrode form.

In the piezoelectric element 10, piezoelectric vibration can be excited by allowing signal input to the external electrodes 22 and 24, so that an electric field is applied between the electrodes 14 arranged in the interdigital form. At this time, the electric field is applied to the piezoelectric ceramic body 12 having a layered perovskite structure substantially perpendicular to the C axis thereof selected and oriented. Thus, a single mode piezoelectric vibration can be excited and the electromechanical coefficient can be increased. Since the electrodes 14 are formed so as to be adjacent to each other in the piezoelectric ceramic body 12, the static capacity between the electrodes 14 connected to the external electrodes 22 and 24 can be increased. Thus, a piezoelectric element having a low impedance can be provided. Accordingly, impedance matching between the piezoelectric element 10 and a circuit can be easily achieved. Furthermore, in the piezoelectric element 10, polarization is caused between electrodes 14 and adjacent electrodes 14. Accordingly, it is not necessary to reduce the thickness of the element for use at a high frequency, and a high mechanical strength can be assured in contrast to a single plate piezoelectric element.

Figure 4:
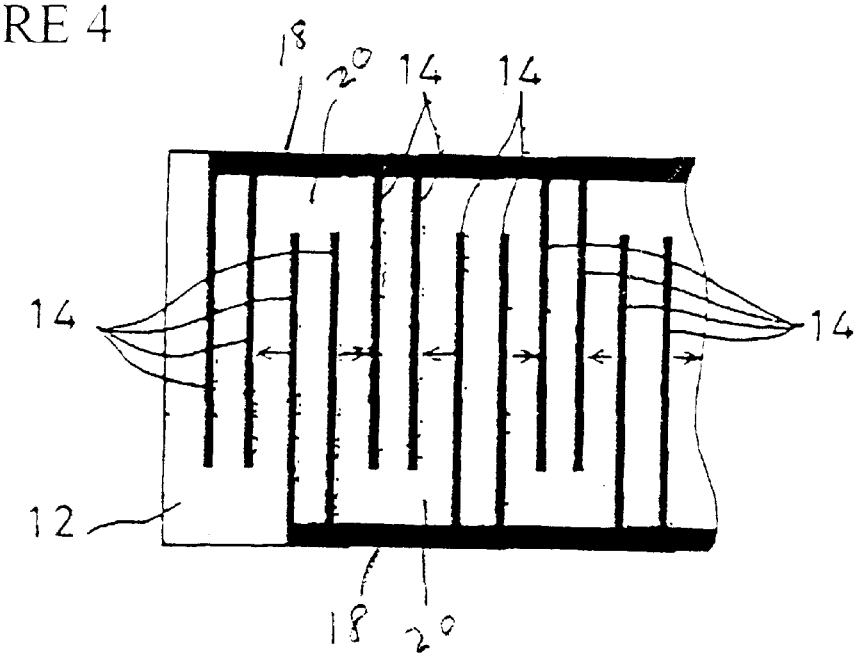
FIG. 4 illustrates further example of the electrode arrangement of the piezoelectric element of the present invention.
Figure 5:
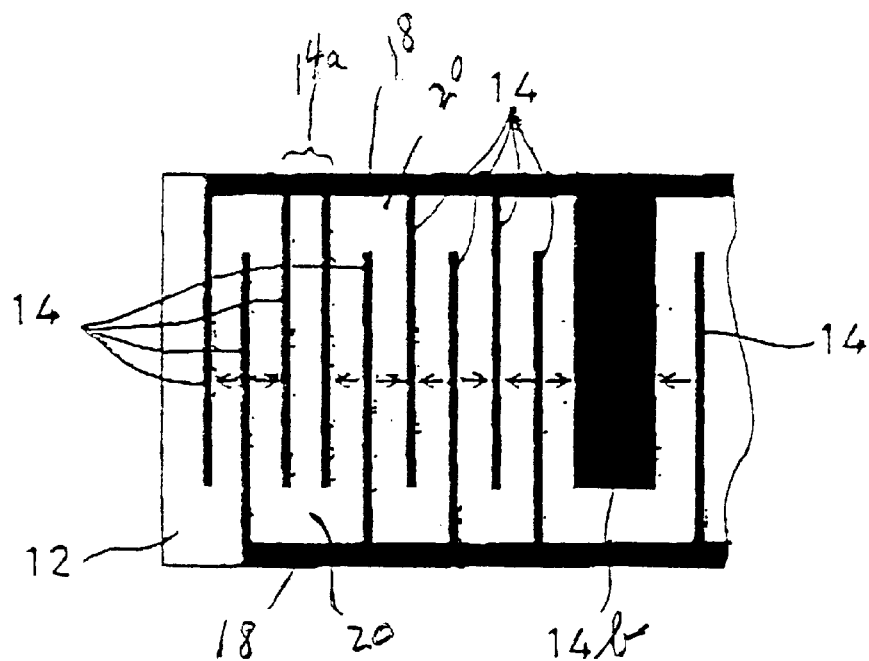
FIG. 5 illustrates still further example of the electrode arrangement of the piezoelectric element of the present invention.

Referring to some advantageous forms interdigital form of the electrodes to be connected to the two external electrodes 22 and 24, as shown in FIG. 4. A set of pairs of comb-teeth electrodes connected to one of the electrodes 22 and 24, and a set of pairs comb-teeth electrodes connected to the other may be alternately arranged. Moreover, as shown in FIG. 5, at least one pair of comb-teeth electrodes 14 (shown at 14a) may be arranged alternately with single comb-teeth electrodes 14. Further, several adjacent comb-teeth electrodes (shown schematically at 14b) may be connected to the same external electrode, so that no electric field can be applied between adjacent comb-teeth electrodes. Alternatively, a large electrode may be substituted for the several adjacent electrodes 14b.

Figure 6:
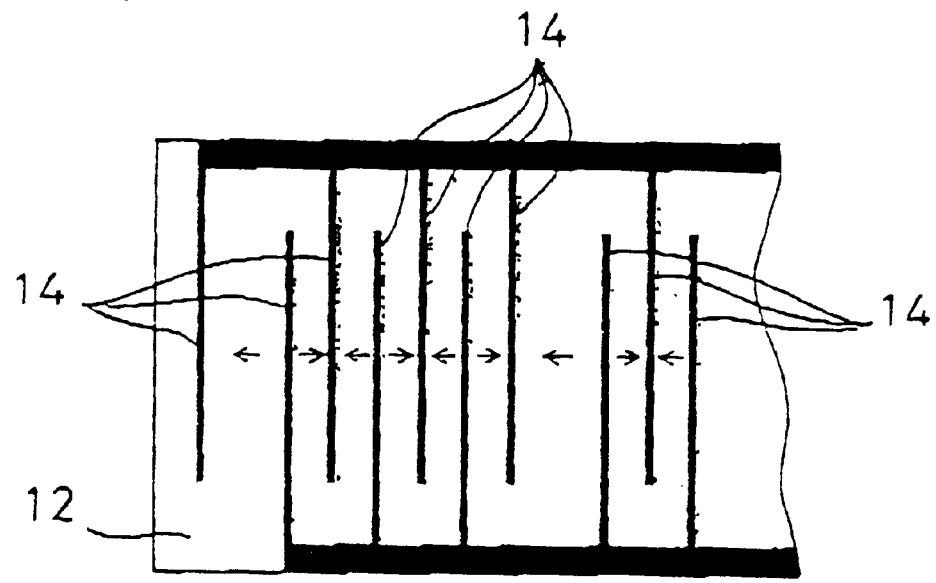
FIG. 6 illustrates yet further example of the electrode arrangement of the piezoelectric element of the present invention.

Furthermore, as shown in FIG. 6, a part of the comb-teeth electrodes having a different polarization degree may be formed by varying the interval between the electrodes 14 to change the intensity of an electric field to be applied for polarization. Moreover, a floating electrode (not shown), not connected to the external electrodes, that is, connected to neither of the potentials, may be formed between plural electrodes 14. Thus, the electromechanical coefficient of the piezoelectric element 10 can be adjusted by changing the configuration of the piezoelectric element 10. Moreover, by changing the widths of plural electrodes 14 (distance between the electrodes) arranged in the piezoelectric ceramic body 12, the electromechanical coefficient and the static capacity of the piezoelectric element 10 can be easily adjusted, since the volume of the piezoelectric ceramic body to be polarized can be changed.

As material for the piezoelectric ceramic body 12, e.g., $Na_{0.5}Bi_{4.6}Ti_4O_{15}$ or the like is used. In addition, when layered perovskite structure type piezoelectric materials of $CaBi_4Ti_4O_{15}$, $SrBi_4Ti_4O_{15}$, $Bi_4Ti_3O_{12}$ or the like are used, a high electromechanical coefficient can be obtained.

Figure 7:
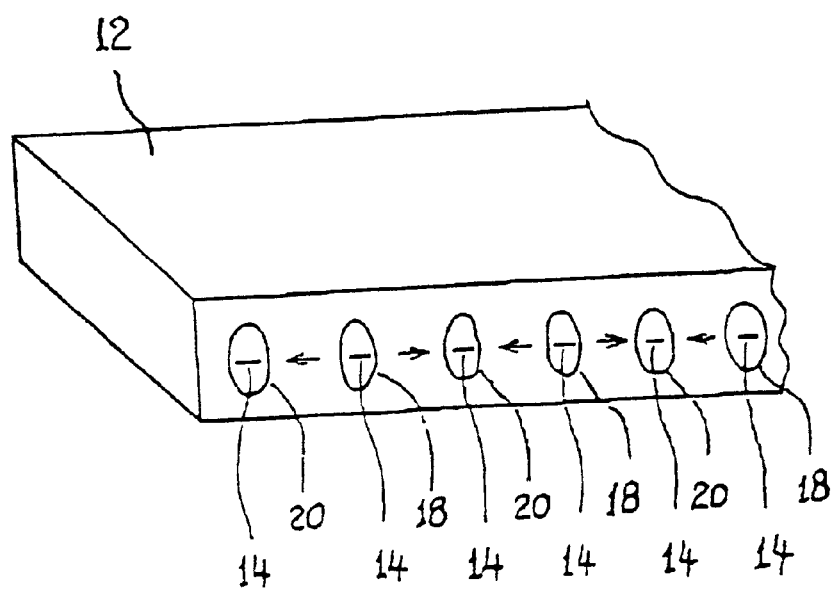
FIG. 7 illustrates an end face of another example of the piezoelectric ceramic body used in the piezoelectric element of the present invention.
Figure 8:
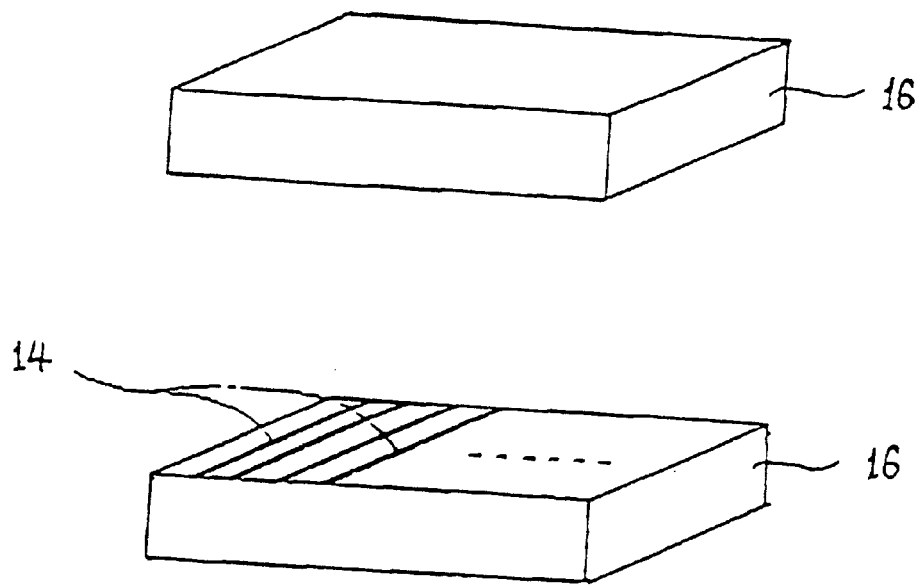
FIG. 8 is an exploded perspective view of the piezoelectric ceramic body shown in FIG. 7.

Moreover, as shown in FIGS. 7 and 8, only one layer of the electrode 14, not being laminated in the thickness direction of the piezoelectric ceramic body 12, may be formed. Also in this case, adjacent electrodes 14 are covered with conductive materials 18 and insulation materials 20 on the opposed side faces of the piezoelectric ceramic body 12, respectively. External electrodes are formed on the side faces where the electrodes 14 are covered with the conductive materials 18 and the insulation materials 20, respectively. In the piezoelectric ceramic body 12, the electrodes 14 are arranged in an interdigital form.

Figure 9:
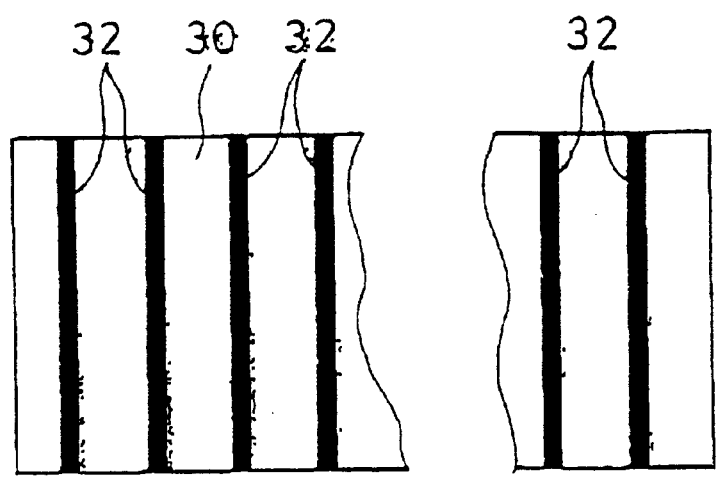
FIG. 9 illustrates an internal electrode pattern on a sheet for use in production of the piezoelectric element of FIG. 1.
Figure 12:
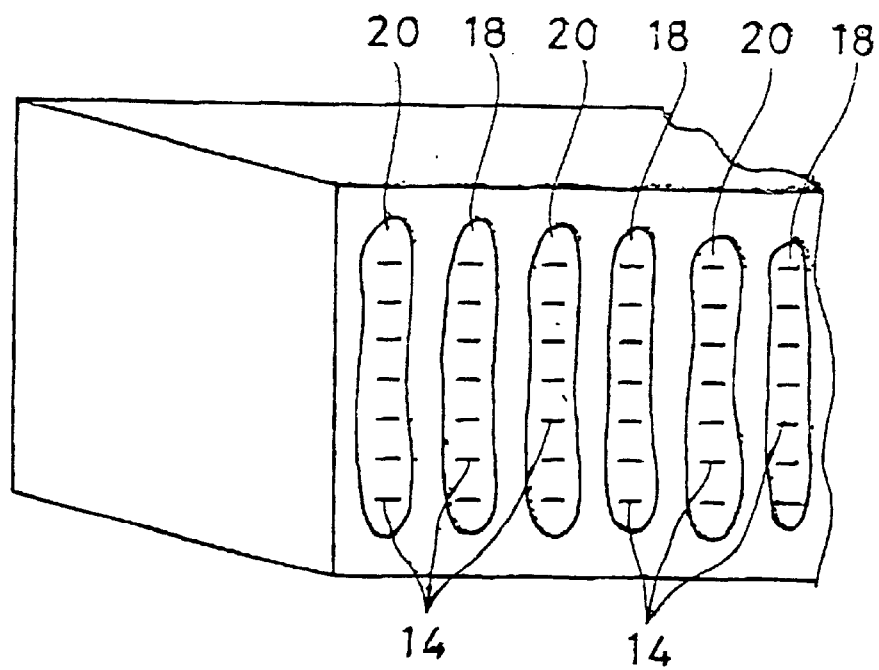
FIG. 12 illustrates a method of forming conductive materials and insulation materials on the cut faces of the element obtained by cutting in the step of FIG. 11.

In order to produce the piezoelectric element 10, first, a piezoelectric material having a layered perovskite structure is prepared. A green sheet 30 is formed by use of the piezoelectric material, as shown in FIG. 9. On the green sheet 30, plural substantially-parallel linear electrode pastes 32 are printed so as to elongate from one end of the green sheet 30 toward the other end thereof. Plural green sheets 30 each having the electrode pastes 32 printed thereon are laminated to each other to form a laminate 34 (FIG. 12). At this time, the green sheets 34 are laminated in such a manner that electrode pastes 32 overlap each other in the lamination direction of the green sheet 30.

Figure 11:
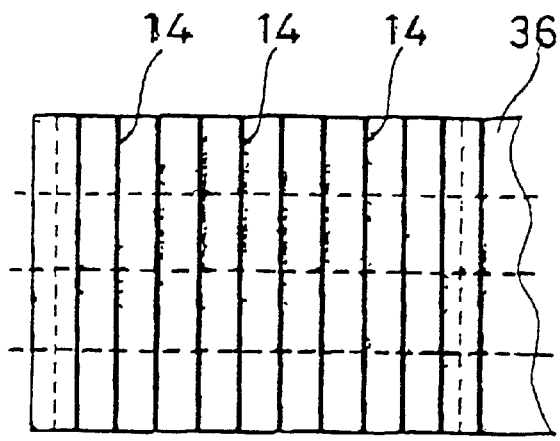
FIG. 11 illustrates a method of cutting a sintered body, produced by sintering of the laminate obtained in the step of FIG. 10, to form elements.

The obtained laminate 34 is fired whereby a sintered body 36 having the electrodes 14 formed therein are produced as shown in FIG. 11. At this time, e.g., by firing the green sheets 30 under pressure being applied in the lamination direction, the sintered body 36 is produced in which the crystallographic C axis is oriented in the lamination direction. The sintered body 36 is cut to a required size as indicated by broken lines in FIG. 11 to form plural elements. It should be noted that the electrodes 14 do not appear on the surface of the sintered body 36, but, in FIG. 11, the electrodes are shown for the purpose of illustrating the relation between the electrodes 14 and the cut portions.

Onto the side faces of the obtained element, the end portions of the electrodes 14 are exposed. The end portions of the electrodes 14 overlapped in the lamination direction of the green sheet 30 are covered alternately with conductive materials 18 and insulation materials 20. Thus, on one of the side faces of the element, the conductive materials 18 and the insulation materials 20 are alternately formed. On the other side face of the element, an electrode 14 covered with the conductive material 18 on the first side face is covered with the insulation material 20, while an electrode 14 covered with the insulation material 20 on the first side face of the element is covered with the conductive material 18.

External electrodes 22 and 24 are formed on the side faces of the element where the conductive materials 18 and the insulation materials 20 are formed, respectively. Thus, the electrodes 14 are connected in the interdigital electrode form. In this state, a d.c. voltage is applied across the external electrodes 22 and 24, so that a direct current field is applied between electrodes 14 and adjacent electrode 14 substantially perpendicular to the orientation direction of the C axis. That is, the element is polarized as indicated by arrow C in FIG. 2. As described above, the piezoelectric element 10 is prepared in which the crystallographic C axis is oriented in the thickness direction of the piezoelectric ceramic body 12, and the piezoelectric ceramic body 12 is polarized substantially in the perpendicular to the C axis.

EXAMPLE

Figure 10:
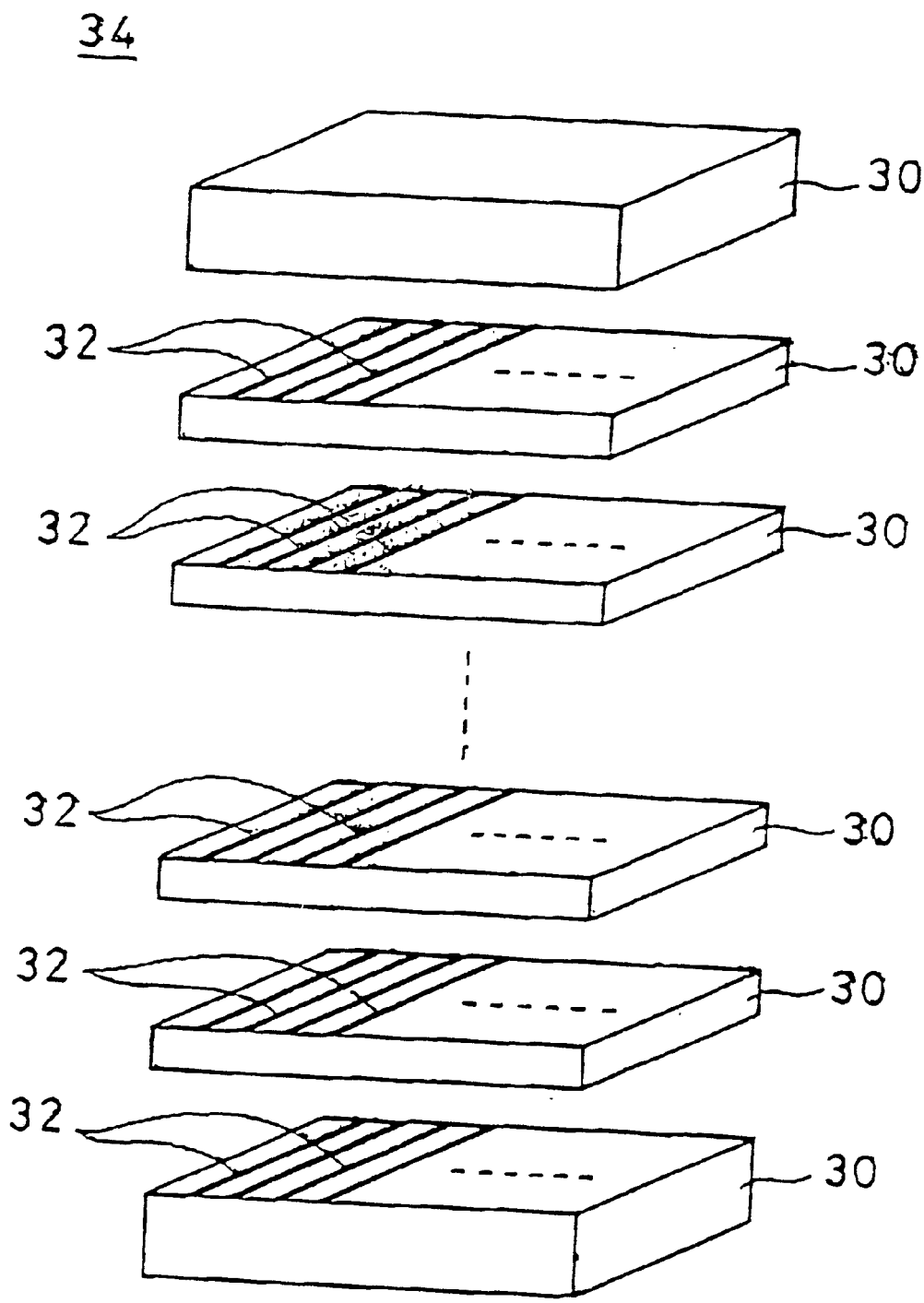
FIG. 10 illustrates sheet lamination in the step of laminating sheets of FIG. 9 and arrangement of the electrodes.

A raw material powder having a composition expressed by formula $Na_{0.5}Bi_{4.6}Ti_4O_{15}$ and 5 to 10% by weight of a vinyl acetate type binder was mixed, and formed into a green sheet by a doctor blade method. A platinum electrode paste 32 was screen-printed in a linear shape, as shown in FIG. 9. The ceramic green sheets were laminated and press-bonded as shown in FIG. 10 to produce a laminate 34. Here, the thicknesses of the lowermost and uppermost layers of the green sheets are about two times of each of the other green sheets, namely, about 300 µm, and the thickness of each of the other green sheets is about 150 µm. The overall thickness of the green sheets 30 before press-bonding was 1.5 µm, and the thickness of the laminate 34 after press-bonding was 1.2 mm.

Figure 13:
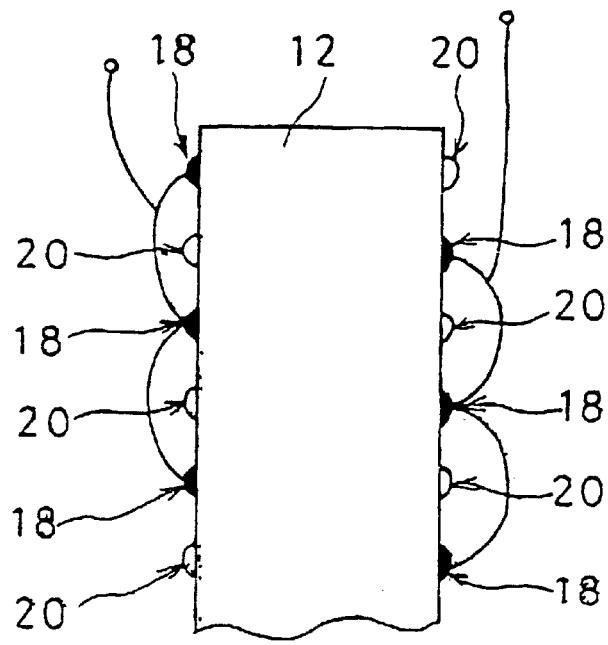
FIG. 13 illustrates connection of the electrodes for metering the characteristic of the element of FIG. 12 of the example of the present invention.

The laminate 34 was fired while it was being pressed in the thickness direction, whereby a sintered body 36 having a layered perovskite structure in which the C axis is oriented in the thickness direction was obtained. The pressure for the pressing was 50 to 500 kg/cm² and the firing temperature was 1000° C. to 1300° C. The thickness of the fired sintered body 36 was about 600 µm. The sintered body 36 was polished to be uniform in thickness, that is, to have a thickness of 500 µm. Thereafter, as indicated by the broken lines in FIG. 11, the sintered body 36 was cut to form elements each having a width of 1 mm and a length of 3.6 mm. By firing, the platinum electrode pastes 32 became electrodes 14. The electrodes 14 do not appear on the surface of the sintered body 36. However, in FIG. 11, the electrodes 14 are shown for illustration of the relation between the electrodes 14 and the cut portions. The electrodes 14 appearing at the cut surface were divided into two groups. At the cut surfaces, only the electrodes 14 belonging to the same group were electrically connected to each other by use of the conductive materials 18 and the insulation materials 20 (FIG. 12). A d.c. electric field was applied across these two groups of the electrodes for polarization. These electrodes were connected to the terminals of an impedance meter as shown in FIG. 13, and the frequency characteristic of the impedance was investigated.

Figure 14:
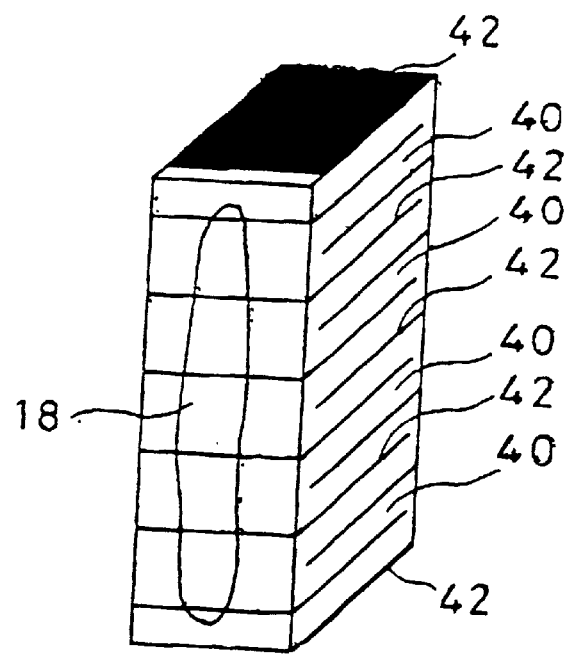
FIG. 14 illustrates an example of a conventional multilayer type piezoelectric element.
Figure 15:
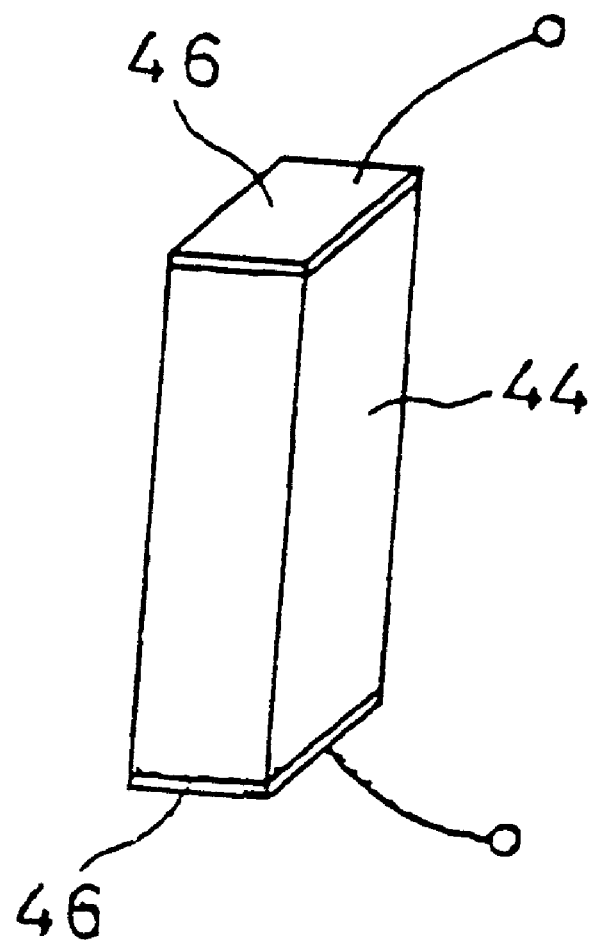
FIG. 15 illustrates an example of a piezoelectric element of a conventional rod shaped piezoelectric body.

The electromechanical coefficients were compared by use of a piezoelectric element having a layered structure composed of piezoelectric layers 40 and electrode layers 42 shown in FIG. 14 formed by using unoriented $Na_{0.5}Bi_{4.5}Ti_4O_{15}$, and a piezoelectric element comprising a rod shaped piezoelectric body 44 having electrodes 46 formed on both end faces thereof shown in FIG. 15. Table 1 shows the results. It is seen that according to the present invention, the impedance can be reduced as compared with that of the piezoelectric element using the rod shaped piezoelectric body, and moreover, the electromechanical coefficient can be increased as compared with the unoriented multilayer type piezoelectric element.

TABLE 1

| Material | Structure | Electro-mechanical coupling coefficient (%) | Static capacity (pF) |
|---|---|---|---|
| Present invention $Na_{0.5}Bi_{4.5}Ti_4O_{15}$ Oriented | Structure of FIG. 2 | 42 | 14 |
| Comparable example $Na_{0.5}Bi_{4.5}Ti_4O_{15}$ Unoriented | Structure of FIG. 2 | 23 | 12 |
| Comparable example $Na_{0.5}Bi_{4.5}Ti_4O_{15}$ Unoriented | Structure of FIG. 14 | 28 | 18 |
| Comparable example $Na_{0.5}Bi_{4.5}Ti_4O_{15}$ Oriented | angular rod (FIG. 15) | 47 | 0.15 |
| Comparable example $PbTi_{0.49}Zr_{0.49}O_3$ + 1 wt.% MnO Unoriented | Structure of FIG. 2 | 43 | 105 |
| Comparable example $PbTi_{0.49}Zr_{0.49}O_3$ + 1 wt.% MnO Unoriented | Structure of FIG. 14 | 49 | 160 |

A piezoelectric actuator having a structure similar to that of the piezoelectric element of the present invention has been proposed. Differences between the structures will be described.

Japanese Unexamined Patent Application Publication No. 3-94487 discloses as a conventional means for enhancing the reliability of a multilayer actuator, a piezoelectric element using an unoriented piezoelectric ceramic body material and having the structure in which interdigital electrodes are laminated similarly to the piezoelectric element 10 of the present invention. This structure has been proposed for the purpose of assuring the mechanical reliability of such a conventional multilayer structure element as shown in FIG. 14. With a conventional multilayer structure, a high mechanical reliability can be sufficiently assured for use in the filters and oscillators contained in electronic apparatuses which are applied in a small electric field. For the multilayer elements having such a structure as shown in FIG. 14, the structure containing the interdigital electrodes reduces the electromechanical coefficients and has been unavailable (see Table 1).

According to the present invention, a piezoelectric ceramic body having a layered perovskite structure is used, and the piezoelectric element has such a configuration that an electric field after firing is applied to the element in the perpendicular to the C axis orientation direction. Accordingly, as compared with the conventional multi-layer structure element as shown in FIG. 14, a significantly high electromechanical coefficient can be realized. In other words, the combination of a piezoelectric material having a layered perovskite structure and the electrode structure creates a large value.

Heretofore, the piezoelectric element 10 having the structure in which the linear electrodes 14 such as interdigital electrodes or the like has been described in reference to the example. The formation positions of the electrodes 14 are not especially limited, provided that similar effects can be obtained. For example, the electrodes 14 may be formed on the surface of the piezoelectric ceramic body 12. Moreover, the dilation is not restricted to uniform dilation. For example, a part having a different dilation phase may be formed in the piezoelectric ceramic body 12 by partially inverting the application direction of an electric field.

In the piezoelectric element of the present invention, a single mode resonance characteristic can be realized by using a piezoelectric material having a layered perovskite structure. Accordingly, a filter and an oscillator having excellent characteristics such as high temperature heat resistance, low high-frequency loss, and so forth, which can not be achieved when lead titanate zirconate, a typical piezoelectric material, is used, can be provided. The piezoelectric element has a low impedance, so that impedance matching to a circuit can be easily attained. A piezoelectric element having a high electromechanical coefficient can be provided.

What is claimed is:

1. A piezoelectric element comprising a piezoelectric ceramic body having a layered perovskite structure in which at least the C axis of the crystallographic axes is oriented, and which is polarized substantially in the direction perpendicular to the orientation direction of the C axis, and a plurality of electrodes arranged on planes substantially parallel to the polarization direction of the piezoelectric ceramic body in the piezoelectric ceramic body, a first group of the electrodes being adapted to be connected to a first potential and a second group of the electrodes being adapted to be connected to a second potential, wherein the electrodes are arranged so that the electrodes adapted to be connected to the first potential and the electrodes adapted to be connected to the second potential contain portions which are adjacent to each other.

2. A piezoelectric element according to claim 1, wherein the plurality of electrodes are arranged in an interdigital electrode form.

3. A piezoelectric element according to claim 2, wherein a plurality of electrodes are disposed on a multitude of planes in the orientation direction of the C axis, and electrodes overlapped with each other are connected to the same potential.

4. A piezoelectric element according to claim 3, wherein the piezoelectric ceramic body is polarized in two opposite directions between electrodes overlapped and adapted to be connected to the first potential and electrodes overlapped and adapted to be connected to the second potential.

5. A piezoelectric element according to claim 1, wherein the piezoelectric ceramic body is selected from the group consisting of $Na_{0.5}Bi_{4.6}Ti_4O_{15}$, $CaBi_4Ti_4O_{15}$, $SrBi_4Ti_4O_{15}$ and $Bi_4Ti_3O_{12}$.

6. A piezoelectric element according to claim 1, wherein a plurality of electrodes are provided on a multitude of planes in the orientation direction of the C axis, and electrodes overlapped with each other are connected to the same potential.

7. A piezoelectric element according to claim 6, wherein the piezoelectric ceramic body is polarized in two opposite directions between electrodes overlapped and adapted to be connected to the first potential and electrodes overlapped and adapted to be connected to the second potential.

8. A piezoelectric element according to claim 1, wherein the piezoelectric ceramic body is polarized in two opposite directions between electrodes adapted to be connected to the first potential and electrodes adapted to be connected to the second potential.

9. A piezoelectric element according to claim 1, wherein the piezoelectric ceramic body is selected from the group consisting of $Na_{0.5}Bi_{4.6}Ti_4O_{15}$, $CaBi_4Ti_4O_{15}$, $SrBi_4Ti_4O_{15}$ and $Bi_4Ti_3O_{12}$.

* * * * *